(12) United States Patent
Zucchelli et al.

(10) Patent No.: US 6,647,619 B2
(45) Date of Patent: Nov. 18, 2003

(54) POSITIONING ARRANGEMENT AND METHOD

(75) Inventors: Libero Zucchelli, Turin (IT); Luigi Gastaldi, Turin (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/213,252

(22) Filed: Aug. 6, 2002

(65) Prior Publication Data

US 2003/0077846 A1 Apr. 24, 2003

(30) Foreign Application Priority Data

Oct. 22, 2001 (EP) .............................. 01308967

(51) Int. Cl.⁷ .............................................. H01R 43/00
(52) U.S. Cl. ....................................................... 29/830
(58) Field of Search ................... 438/14, 18; 174/267, 174/266; 361/786; 439/66; 428/209; 29/830

(56) References Cited

U.S. PATENT DOCUMENTS 5,337,398 A 8/1994 Benzoni et al. ............... 385/90
6,188,028 B1 * 2/2001 Haba et al. ................. 174/266
6,237,218 B1 * 5/2001 Ogawa et al. ................ 29/830

FOREIGN PATENT DOCUMENTS

EP   0 909 117 A2   4/1999

OTHER PUBLICATIONS

Mielke, W., Examiner. European Search Report, Application No. EP 01 30 8967, dated Feb. 26, 2002.

* cited by examiner

Primary Examiner—John F. Niebling
Assistant Examiner—Andre C Stevenson

(57) ABSTRACT

The arrangement includes first and second patterns such as photolithographic patterns of electrically conductive indicia provided on respective first and second surfaces of the components to be positioned. The patterns are adapted for relative movement in sliding contact relationship along the positioning axis. The patterns of electrically conductive indicia define electrically conductive pads at least one of which reaches the condition of being either open or closed when the surfaces on which the patterns are provided reach a given position along the positioning axis. Sensing is preferably effected by means of an amperometer.

9 Claims, 2 Drawing Sheets

POSITIONING ARRANGEMENT AND METHOD

FIELD OF THE INVENTION

The present invention relates to the relative positioning of components, the term "component" being used herein in general terms to indicate any device.

The invention was developed by paying specific attention to the possible use for accurate positioning of electronic, optical and/or electro-optical devices and parts thereof.

DISCUSSION OF THE BACKGROUND ART

In that area of application, optical alignment arrangements are frequently used which involve standard microscope lens arrangements. The corresponding processes are generally cumbersome and expensive to implement, while also requiring complex software tools. This applies particularly to methods based on pattern recognition techniques.

When optoelectronic devices such as lasers or photodiodes are to be positioned, methods may be resorted to involving reading and optimising photocurrents induced by optical signals in one or more of the components being positioned. This requires the optoelectronic device(s) to be displaced together with its/their electrical connections, which generally increases the complexity of any corresponding pick-up tool.

In U.S. Pat. No. 5,998,226, a system and a method are disclosed for determining the misalignment between openings located in the contact layer and the interconnect layer of a semiconductor component. Defective semiconductors can thus be readily identified. Specifically, a single multi-functional structure formed in the contact layer is used to determine the alignment accuracy of the contact layer and the interconnect layer by inline visual inspection and determination of the end of line electrical resistance properties of the semiconductor wafer. This solution still requires visual inspection with the ensuing disadvantages outlined in the foregoing.

SUMMARY OF THE INVENTION

The object of the present invention is to provide an arrangement for the accurate relative positioning of a first component and a second component wherein the intrinsic disadvantages of the prior art solutions considered in the foregoing are dispensed with.

According to the present invention, such an object is achieved by means of an arrangement having the features set forth in the claims which follows. The invention also relates to the method of using such an arrangement.

The solution of the invention exploits electrically conductive patterns, preferably at least partly provided in the form of metallic tracks located on opposed surfaces of the two components to be aligned.

The relative misalignment of the two components can thus be detected and evaluated by using simple and inexpensive electrical measurement tools. Accurate relative positioning of the two components in question can be achieved by means of an automated system adapted to produce small relative movements ("micromovements") of the two components while monitoring the current flowing through the conductive tracks.

The electrically conductive tracks are provided in the form of conductive patterns "written" e.g. by photolithographic processes on the opposed surfaces of the components to be positioned. The geometry of the patterns is chosen in such a way that electrical contacts are opened or closed depending on the mutual positioning of the two components.

BRIEF DESCRIPTION OF THE DRAWING

The invention will now be described, by way of example only, with reference to the annexed drawings, wherein.

DETAILED DESCRIPTION OF THE PREFERRED EMBODIMENT

Figure 1:
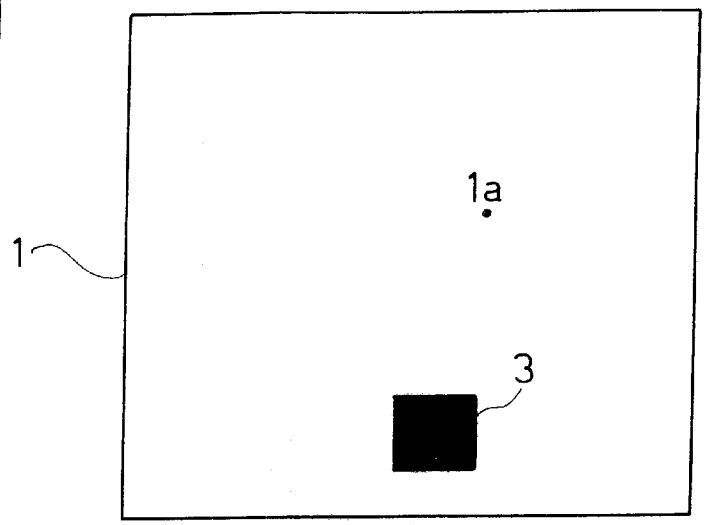
FIG. 1 is a schematic view of a part of the arrangement of the invention.

In the drawings, references 1 and 2 designate two components (e.g. two devices) which are to be positioned with respect to each other with a high degree of accuracy.

In the figures enclosed, components 1 and 2 are schematically represented in the form of generally flat rectangular bodies. Exemplary of such bodies are e.g. a photoelectronic component such as a photodetector 1 to be accurately positioned with respect to a support member such as a so-called silicon optical bench (SiOB) 2.

Reference to such a possible, intended application must not be construed, however, in a limiting way of the scope of the invention.

In fact, the arrangement of the invention may be adopted for accurately positioning any first component 1 and second component 2 having respective first and second surfaces such as surfaces 1a, 2a shown in the drawings adapted for relative positioning at a given, pre-defined position along a given axis.

In the following, reference will be primarily made to positioning along a single axis designated x in the drawings.

Figure 2:
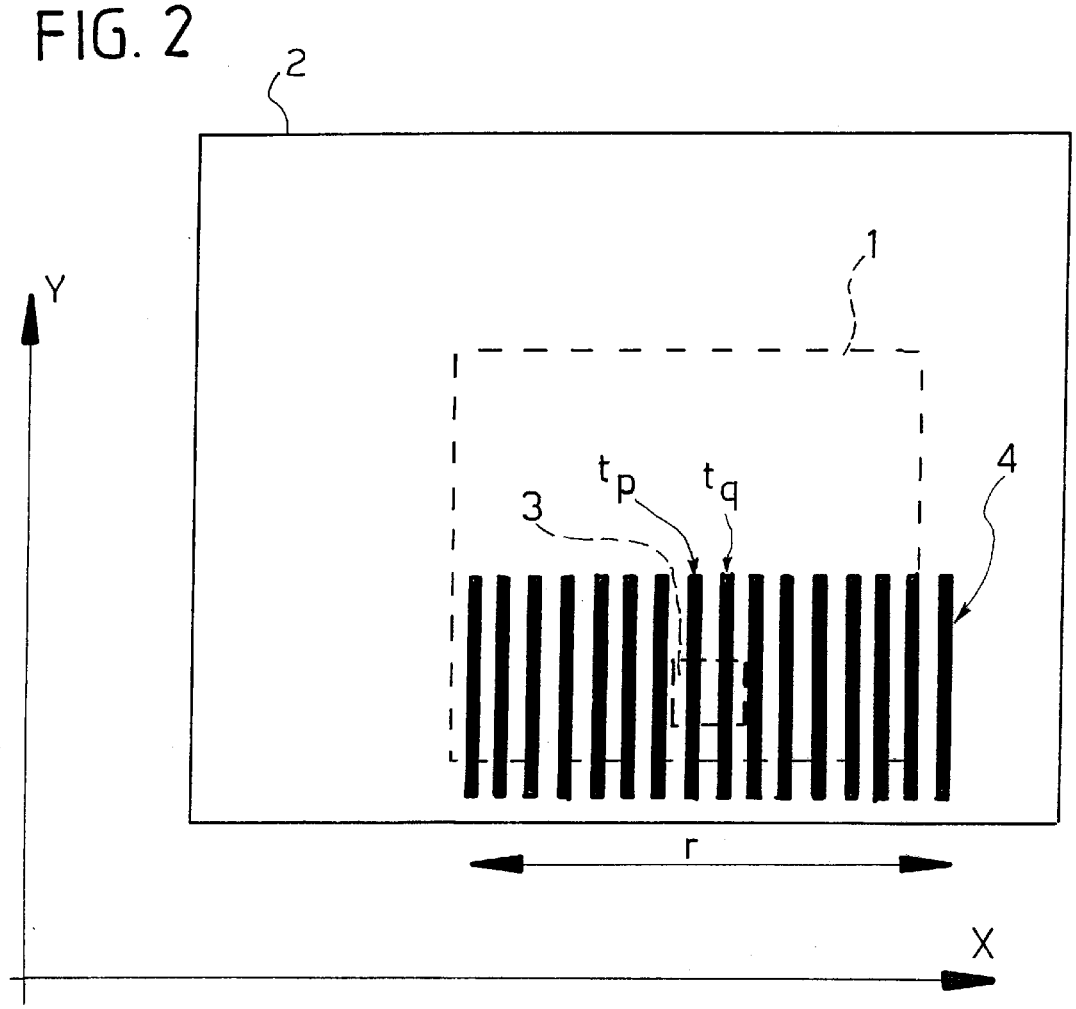
FIG. 2 and FIG. 3 disclose in greater detail the features of the arrangement of the invention.
Figure 4:
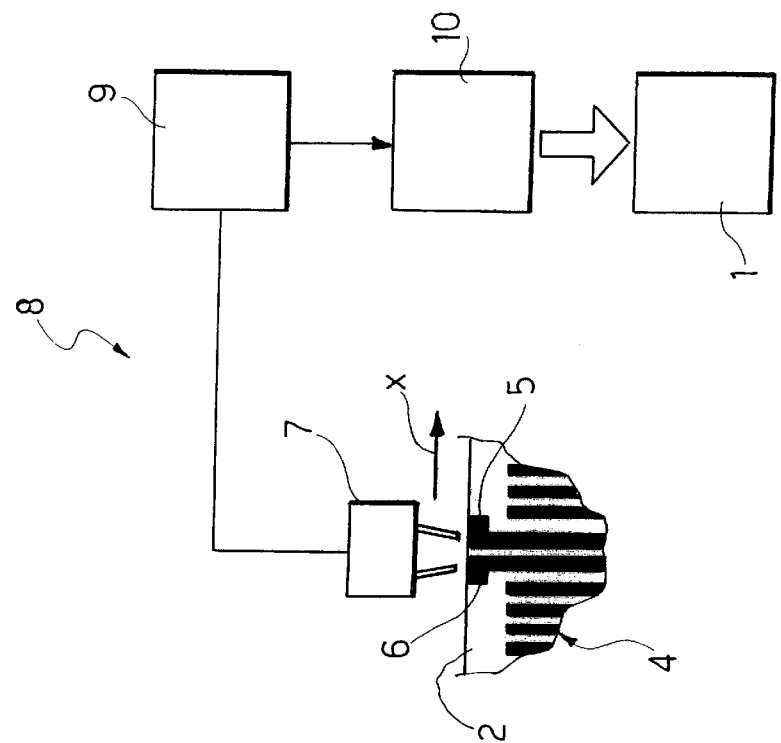
FIG. 4 is a schematic functional block diagram of a positioning system operating according to the invention.
Figure 3:
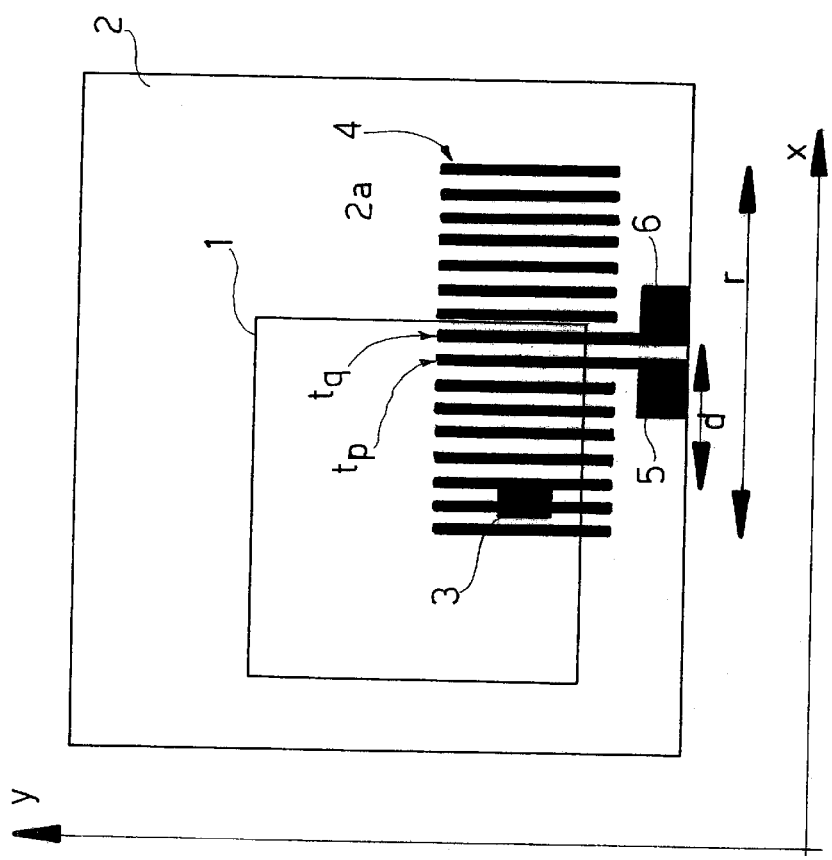

Those skilled in the art will however appreciate that the arrangement of the invention may in fact be replicated in order to obtain accurate positioning along a plurality of axis, such as e.g. axis y shown in FIGS. 2 and 3.

Reference numerals 3 and 4 designate first and second lithographic patterns of electrically conductive indicia provided on surfaces 1a and 2a, respectively. Patterns 3 and 4 are thus adapted for relative movement along axis x in sliding contact therebetween.

As used herein, "lithographic" will mean any technique adapted to form such patterns of electrically conductive indicia by using a writing/printing technique possibly involving the use of radiation such as electron/ion beam or electromagnetic radiation such as optical radiation, "optical" being obviously meant to include e.g. also infrared (IR) and ultraviolet (UV) radiation.

In a preferred embodiment of the invention, patterns 3 and 4 are obtained by standard photolithographic processes involving the following steps:

forming a continuous metallic layer over the respective surface 1a, 2a, applying a resist over the metallic layer, selectively exposing the resist to curing/polymerising radiation through a mask reproducing the pattern to be formed, removing the unexposed resist, selectively etching (by chemical/physical etching processes) the metal layer from the areas left uncovered by the resist, and removing the residues of resist.

These processes are conventional in the art and do not require to be described in detail herein.

Those skilled in the art will promptly appreciate that substantially similar results can be achieved by resorting to alternative processes which are similarly known in the art.

In the arrangement shown herein, pattern 3 is in the form a single rectangular pad: alternative arrangements can however be used as will be promptly understood by those skilled in the art upon reading this description.

Pattern 4 is in the form of regular array of n parallel linear conductive tracks extending in a direction generally crosswise (and preferably orthogonal) to axis x, i.e. the axis along which exact positioning is sought. In the arrangement shown herein, the tracks of pattern 4 have identical widths and are separated by a given distance which is constant throughout the pattern, said widths and said distances being measured in the direction of axis x.

Patterns including tracks of different widths and/or separated by different distances (e.g. to give rise to a nonius-like arrangement) are within the scope of the invention.

Preferably, pattern 4 has an overall length r in the direction of the x axis.

The schematic view of FIG. 2 represents the exact relative positioning of components 1 and 2 along the x axis which is intended to be achieved by the arrangement of the invention.

Under these circumstances, namely when components 1 and 2 are in the correct relative position sought, the pad comprising first pattern 3 extends over two tracks of pattern 4 designated $t_p$ and $t_q$, respectively. Pad 3 thus forms a conductive bridge connecting such tracks.

Conversely, in any other position not corresponding to the exact relative positioning sought, pad 3 will act as a conductive bridge electrically connecting two tracks of pattern 4 which will be generally different from tracks $t_p$ and $t_q$ (or fail to provide any electrical connection).

The two patterns of electrically conductive indicia designated 3 and 4 thus define at least one electrically conductive path which reaches at least one condition of being either open or closed depending on first and second surfaces 1a, 2a having reached a given position along axis x.

Such an arrangement thus permits accurate positioning of components 1 and 2 by means of simple electrical measurement (essentially the presence of a closed or open circuit) which is adapted to be performed e.g. by means on amperometer. A wide variety of arrangements for performing such electrical measurement can be devised.

In general terms (by referring to FIG. 3) if component 1 is positioned over component 2 with an error d (d<r/2), an amperometer will reveal a short circuit between two subsequent tracks of pattern 4. An alignment system may thus produce relative movement of components 1 and 2 along the x axis (this may be accomplished e.g. by moving component 1 with respect to component 2 or vice versa) thus displacing pattern 3 with respect to pattern 4 in the increasing or decreasing direction of axis x, depending on the initial position. Relative movement is continued until a short circuit condition is sensed (measured) which corresponds to pad 3 conductively bridging tracks $t_p$ and $t_q$, i.e. the exact positioning sought.

The same procedure can of course be repeated to align the two components 1 and 2 in different directions (e.g. the direction of axis y shown in FIGS. 2 and 3) using another pattern of indicia thoroughly similar to pattern 4 including tracks arranged in an orthogonal direction with respect to the y axis i.e. orthogonal to tracks of pattern 4.

It will be appreciated that the same rectangular pattern comprised of pad 3 can be used also for positioning along the y axis.

FIG. 3 schematically shows an embodiment of the invention wherein tracks $t_p$ and $t_q$ of pattern 4 are provided with two end extensions in the form of rectangular pads 5 and 6 whose dimensions are generally larger than those of tracks $t_p$ and $t_q$.

In fact, width/distance of such tracks—and the tracks of pattern 4 in general—is related to the resolution (i.e. accuracy) of positioning sought. The narrower and closer the tracks of pattern 4, the more accurate the positioning will be.

Conductive pads 5 and 6 enable any short circuit established by pad 3 between tracks $t_p$ and $t_q$ to be sensed (thus revealing that the correct positioning has been achieved) by means of an amperometric probe 7 having contacts (or "needles") adapted to contact sensing pads 5 and 6.

Such probes are well known in the art, also in view of the extensive use made in the so-called "needle-bed" arrangements currently used in the final stages of IC manufacturing in order to detect faulty chips to be discarded before the wafer slice is subject to scribing and cutting.

While such probes can be manufactured of such reduced size to be able to detect short circuit conditions between pairs of very closely spaced adjacent tracks included in a pattern such as pattern 4, the availability of wider contact areas such as sensing pads 5 and 6 shown in FIG. 3 may render the respective sensing process and system less critical.

Probe 7 can be associated to a system, generally designated 8 in FIG. 3, adapted to selectively produce relative movement along the x axis of component 1 and component 2.

The output signal from sensing probe 7 is fed to a control system (of a known type) 9 which controls actuator(s) 10—of any known type (e.g. of a piezoelectric type)—which effect the relative movement of components 1 and 2.

Actuator(s) 10 are generally operated to seek the positioning by means of a scanning movement along axis x which leads pattern 3 to scan pattern 4 starting from either end thereof (see for instance FIG. 3).

Such a scanning movement progresses until probe 7 senses—by contacting pads 5 and 6—that a short circuit condition has been established between tracks $t_p$ and $t_q$ due to pad 3 having reached the positioning shown in FIG. 2. At that point the scanning movement is discontinued, the exact positioning sought having been reached.

Of course, the basic principles of the invention remaining the same, the details of construction and the embodiments may widely vary with respect to what has been described and illustrated purely by way of example, without departing from the scope of the present invention as defined by the annexed claims.

What is claimed is:

1. An arrangement for the relative positioning of a first component and a second component, said first and second components having respective first and second surfaces adapted for positioning at a given position along a given axis, wherein said arrangement includes first and second patterns of electrically conductive indicia provided on said first and second surfaces, said patterns being adapted for relative movement along said axis in sliding contact therebetween, whereby said first and second patterns of indicia jointly define at least one electrically conductive path which reaches at least one condition of being either electrically open or closed depending on said first and second surfaces having reached said given position of said movement along said given axis.

2. The arrangement of the claim 1, wherein at least one of said first and second patterns are lithographic patterns.

3. An arrangement for the relative positioning of a first component and a second component, said first and second components having respective first and second surfaces adapted for positioning at a given position along a given axis, wherein said arrangement includes first and second patterns of electrically conductive indicia provided on said first and second surfaces, said patterns being adapted for relative movement along said axis in sliding contact therebetween, whereby said first and second patterns of indicia jointly define at least one electrically conductive path which reaches at least one condition of being either open or closed depending on said first and second surfaces having reached said given position of said movement along said given axis, and wherein at least one of said first and second patterns includes a plurality of parallel conductive tracks extending crosswise of said given axis and the other of said first and second patterns includes at least one electrically conductive pad adapted to electrically connect at least one pair of adjacent tracks of said plurality of parallel conductive tracks, wherein said at least one condition corresponds to said pad electrically connecting the adjacent tracks of said at least one pair.

4. The arrangement of claim 1, wherein at least one of said patterns includes sensing members for electrically sensing said at least one condition.

5. The arrangement of claim 4, wherein said sensing members include sensing pads provided on at least one of said first and second surfaces.

6. The arrangement of claim 5, wherein said sensing pads are in the form of expanded extensions of said tracks of said at least one pair.

7. A method for the relative positioning of a first component and a second component, said method comprising:

providing an arrangement for the relative positioning of a first component and a second component, said first and second components having respective first and second surfaces adapted for positioning at a given position along a given axis, wherein said arrangement includes first and second patterns of electrically conductive indicia provided on said first and second surfaces, said patterns being adapted for relative movement along said axis in sliding contact therebetween, whereby said first and second patterns of indicia jointly define at least one electrically conductive path which reaches at least one condition of being either open or closed depending on said first and second surfaces having reached said given position of said movement along said given axis, and sensing the electrical continuity of said at least one electrically conductive path to detect when said at least one electrically conductive path reaches said at least one condition, whereby said at least one electrically conductive path reaching said at least one condition is indicative of said first and second components having reached said given position along said given axis.

8. The method of claim 7, wherein said sensing is carried out by means of an amperometer.

9. The method of claim 7, further comprising:

causing a relative movement of said first and second components along said given axis, and discontinuing said relative movement upon sensing said at least one condition being reached by said at least one electrically conductive path.

* * * * *